United States Patent
Yueh et al.

(10) Patent No.: US 10,438,975 B1
(45) Date of Patent: Oct. 8, 2019

(54) DISPLAY DEVICE AND METHOD FOR PREPARING THE SAME

(71) Applicant: InnoLux Corporation, Miao-Li County (TW)

(72) Inventors: Jui-Jen Yueh, Miao-Li County (TW); Kuan-Feng Lee, Miao-Li County (TW)

(73) Assignee: Innolux Corporation, Chu-Nan, Miao-Li County (TW)

( * ) Notice: Subject to any disclaimer, the term of this patent is extended or adjusted under 35 U.S.C. 154(b) by 0 days.

(21) Appl. No.: 15/919,649

(22) Filed: Mar. 13, 2018

(51) Int. Cl.
| | |
|---|---|
| *H01L 27/12* | (2006.01) |
| *H01L 21/768* | (2006.01) |
| *H01L 23/48* | (2006.01) |
| *H01L 27/32* | (2006.01) |
| *H01L 21/306* | (2006.01) |
| H01L 51/50 | (2006.01) |
| H01L 27/15 | (2006.01) |
| H01L 33/06 | (2010.01) |

(52) U.S. Cl.
CPC ...... *H01L 27/124* (2013.01); *H01L 21/30604* (2013.01); *H01L 21/76898* (2013.01); *H01L 23/481* (2013.01); *H01L 27/1218* (2013.01); *H01L 27/1262* (2013.01); *H01L 27/156* (2013.01); *H01L 27/3276* (2013.01); *H01L 33/06* (2013.01); *H01L 51/502* (2013.01); *H01L 2227/323* (2013.01)

(58) Field of Classification Search
CPC ............ H05K 3/323; H05K 2203/0278; G02F 2001/133388; G02F 1/13452
See application file for complete search history.

(56) References Cited

U.S. PATENT DOCUMENTS

| | | | | |
|---|---|---|---|---|
| 4,521,442 | A | * | 6/1985 | Guarnieri ................. F24J 2/488 126/569 |
| 2007/0144771 | A1 | * | 6/2007 | Chen ....................... H05K 3/361 174/260 |
| 2017/0256600 | A1 | | 9/2017 | Sano et al. |
| 2017/0257939 | A1 | * | 9/2017 | Sano ....................... H05K 3/361 |

* cited by examiner

*Primary Examiner* — Charles D Garber
*Assistant Examiner* — Alia Sabur
(74) *Attorney, Agent, or Firm* — Muncy, Geissler, Olds & Lowe, P.C.

(57) ABSTRACT

A display device is disclosed, which includes: a substrate, including a first via, a first surface and a second surface opposite to the first surface, wherein the first via has a first sidewall having a first roughness; a connecting element disposed in the first via; a bonding element disposed on the first surface, wherein the bonding element includes a third surface in contact with the connecting element, and the third surface has a second roughness; and a circuit element disposed on the second surface, wherein the circuit element electrically connects to the bonding element through the connecting element, wherein the first roughness of the first sidewall is greater than the second roughness of the third surface. In addition, a method for preparing the aforesaid display device is also disclosed.

20 Claims, 6 Drawing Sheets

US 10,438,975 B1

DISPLAY DEVICE AND METHOD FOR PREPARING THE SAME

BACKGROUND

1. Field

The present disclosure relates to a display device and a method for preparing the same.

2. Description of Related Art

With the continuous advancement of technologies related to electronic devices, all the electronic devices are now developed toward compactness, thinness, and lightness. For example, thin display devices are the mainstream display devices on the market. Even though the available electronic devices on the market are compact, thin and/or light, efforts are still needed. For example, in the display devices, the circuit arrangement in the border region still has to be optimized, to achieve the purpose of a display device with a narrow border region.

Hence, it is desirable to provide a display device with a narrow border region to meet the customer's requirement.

SUMMARY

The present disclosure provides a display device, which comprises: a substrate comprising a first via, a first surface and a second surface opposite to the first surface, wherein the first via has a first sidewall having a first roughness; a connecting element disposed in the first via; a bonding element disposed on the first surface, wherein the bonding element comprises a third surface in contact with the connecting element, and the third surface has a second roughness; and a circuit element disposed on the second surface, wherein the circuit element electrically connects to the bonding element through the connecting element, wherein the first roughness of the first sidewall is greater than the second roughness of the third surface.

The present disclosure also provides a method for preparing the aforementioned display device, which comprises: providing a substrate comprising a first surface and a second surface opposite to the first surface; forming a bonding element on the first surface; forming a first via penetrating the substrate; etching a part of the substrate at a periphery of the first via; disposing a connecting element in the first via; and disposing a circuit element on the connecting element, wherein the circuit element electrically connects to the bonding element through the connecting element, wherein the first via has a first sidewall having a first roughness, the bonding element comprises a third surface in contact with the connecting element, the third surface has a second roughness, and the first roughness of the first sidewall is greater than the second roughness of the third surface.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other element, but also intended indirectly contact with the other element. Similarly, the ordinals recited in the specification and the claims such as "below", or "under" are intended not only directly contact with the other element but also intended indirectly contact with the other element.

In addition, the features in different embodiments of the present disclosure can be mixed to form another embodiment.

Embodiment 1

Figure 1A:
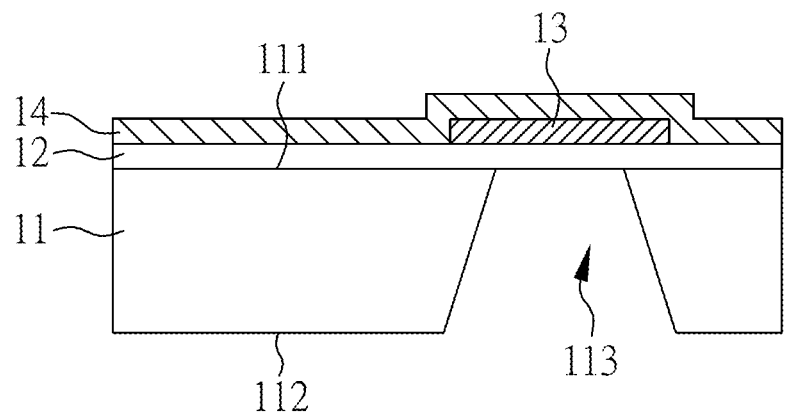
FIG. 1A to FIG. 1C are cross-sectional views of a part of a display device, which show a method for preparing the display device according to Embodiment 1 of the present disclosure.
Figure 1B:
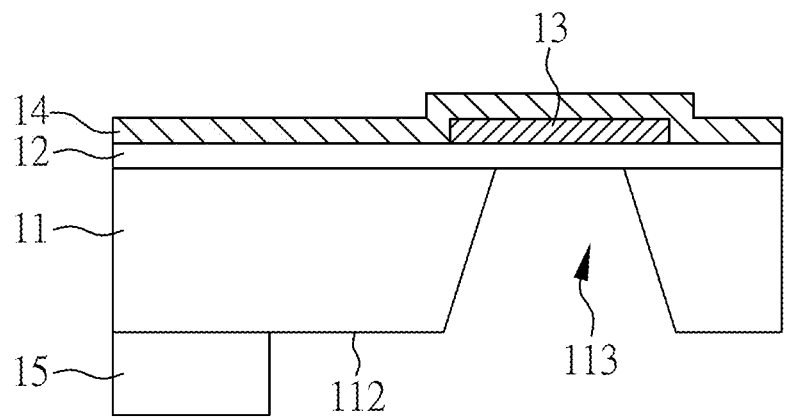
Figure 1C:
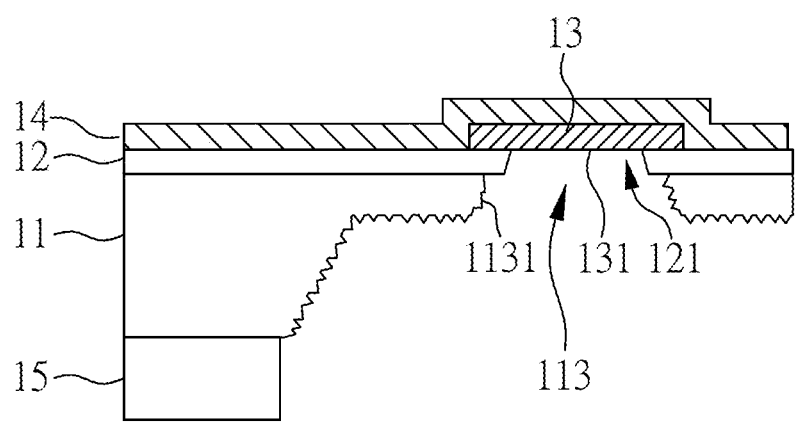
Figure 2:
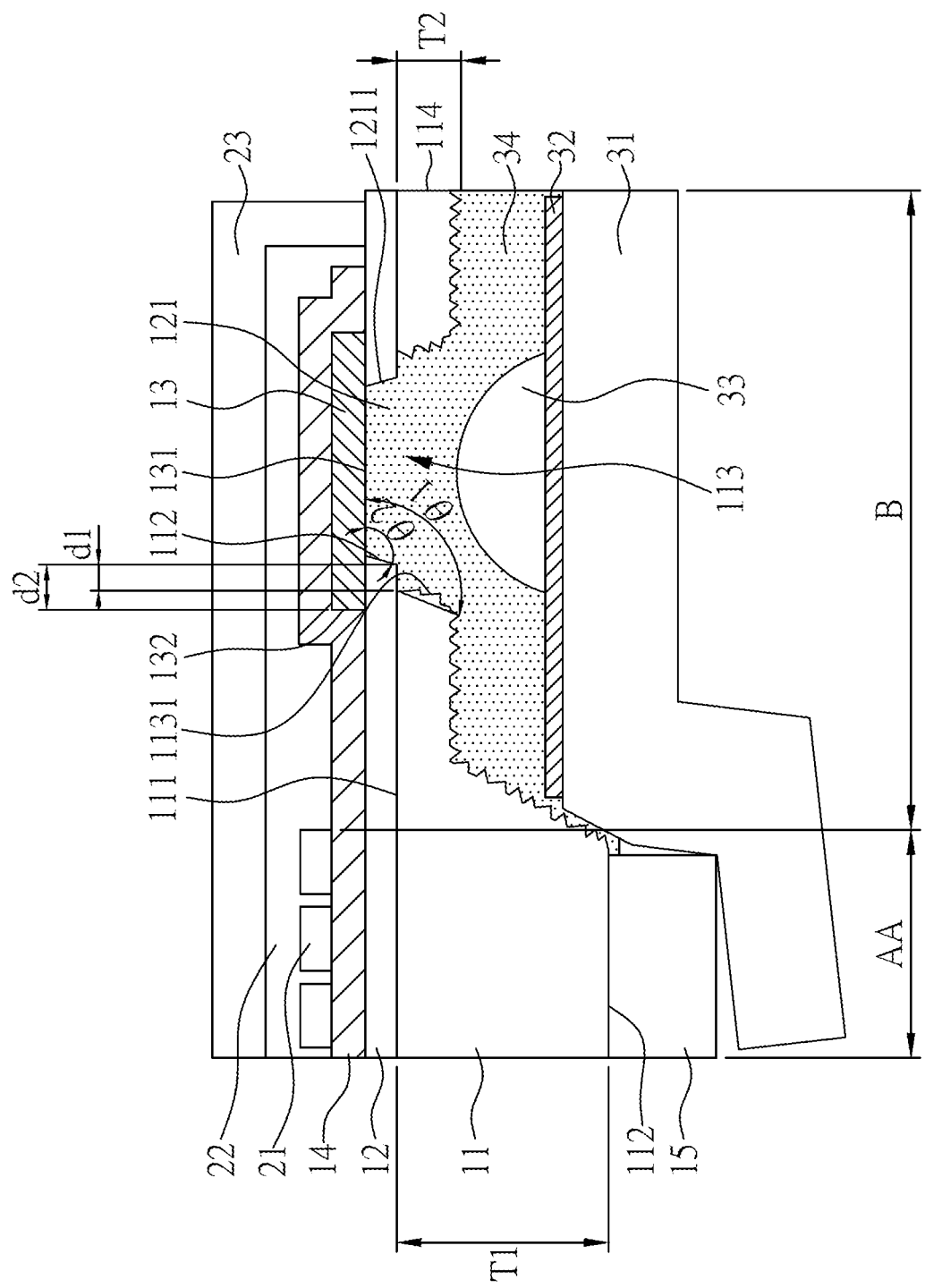
FIG. 2 is a cross-sectional view of a part of a display device according to Embodiment 1 of the present disclosure.

FIG. 1A to FIG. 1C are cross-sectional views of a part of a display device, which show a method for preparing the display device according to the present embodiment, and FIG. 2 is a cross-sectional view of a part of a display device of the present embodiment. It could be understood that the present disclosure is not limited to the order of the following steps.

First, as shown in FIG. 1A, a substrate 11 is provided, which can be a rigid substrate and the material of which can comprise quartz, glass, wafer, sapphire, or etc. The substrate 11 also can be a flexible substrate and the material of which can comprise PC, PI, PP, PET, or other plastic material. The substrate 11 comprises a first surface 111 and a second surface 112 opposite to the first surface 111, and a bonding element 13 is formed on the first surface 111. Optionally, in the present embodiment, an insulating layer 12 is formed on the first surface 111 and the bonding element 13 is formed on the insulating layer 12, and the material of the insulating layer 12 can be, for example, silicon oxide, silicon nitride, silicon oxynitride or a combination thereof. However, in other embodiment of the present disclosure, the insulating layer 12 is not necessarily to be disposed. Furthermore, a first conductive layer 14 is further formed on the bonding element 13, and the first conductive layer 14 electrically connects to the bonding element 13. The first conductive layer 14 can be, for example, a pixel electrode, a transistor, a data line, a gate line, a gate in array (GIA) circuit, a gate on panel (GOP) circuit, or a combination thereof. Herein, the bonding element 13 can comprise a metal oxide layer, and the material of the metal oxide layer can be, for example, ITO, IZO, ITZO, IGZO, AZO or a combination thereof, which can protect the first conductive layer 14 from corrosion. However, the present disclosure is not limited thereto.

Next, a first via 113 penetrating the substrate 11 is formed. The method for forming the first via 113 can be laser drilling, but the present disclosure is not limited thereto. Herein, the laser drilling is performed to form the first via 113, to ensure the first via 113 aligned with the bonding element 13 well.

As shown in FIG. 1B, a supporting film 15 is disposed on the second surface 112 of the substrate 11. More specifically, the supporting film 15 is disposed on a region of the second surface 112 outside the first via 113. The material of the supporting film 15 can be a plastic film, a resin film, a photoresist film, or other film which can resist the following etching process. Herein, the supporting film 15 is used as an etching barrier layer to protect the region of the substrate 11 which is not going to be etched in the following etching process. Or, the supporting film 15 is used as a supporting base providing additional mechanical strength to the substrate 11.

As shown in FIG. 1C, a part of the substrate 11 at the periphery of the first via 113 is etched, which can be accomplished by dry etching, for example, plasma etching. It could be understood that the term "periphery of an object" refers to an area lying beyond a limited range of distances from the object. In addition, the insulating layer 12 is also etched, a second via 121 penetrating the insulating layer 12 is formed, and the second via 121 connects to the first via 113 and exposes a third surface 131 of the bonding element 13. In some embodiment of the present disclosure, the supporting film 15 may be removed after the etching process.

As shown in FIG. 2, after the etching process, a connecting element 34 is disposed in the first via 113 as well as in the second via 121. Herein, the connecting element 34 may be a film or a gel comprising plural conductive particles. An example of the connecting element 34 can comprise an anisotropic conductive film (ACF) or the like, but the present disclosure is not limited thereto.

Next, a circuit element 31 is disposed on the connecting element 34, wherein the circuit element 31 electrically connects to the bonding element 13 through the connecting element 34. Herein, the circuit element 31 can be any flexible circuit element, for example, a flexible print circuit (FPC) or the like, but the present disclosure is not limited thereto.

As shown in FIG. 2, the display device of the present embodiment comprises: a substrate 11, comprising a first via 113, a first surface 111 and a second surface 112 opposite to the first surface 111, wherein the first via 113 has a first sidewall 1131 having a first roughness; a connecting element 34, disposed in the first via 113; a bonding element 13, disposed on the first surface 111, wherein the bonding element 13 comprises a third surface 131 in contact with the connecting element 34, and the third surface 131 has a second roughness; and a circuit element 31, disposed on the second surface 112, wherein the circuit element 31 electrically connects to the bonding element 13 through the connecting element 34, wherein the first roughness of the first sidewall 1131 is greater than the second roughness of the third surface 131.

In the present embodiment, the first roughness of the first sidewall 1131 is greater than the second roughness of the third surface 131. The material of the bonding element 13 can be a metal oxide layer, which is more compact compared to the material of the substrate 11, so the second roughness of the third surface 131 is less than the first roughness of the first sidewall 1131 after the etching process. In addition, the greater first roughness of the first sidewall 1131 can increase the surface of the first sidewall 1131 contacting the connecting element 34 to prevent the circuit element 31 being peeled from the substrate 11. Furthermore, because the circuit element 31 can be embedded into the periphery of the first via 113 of the substrate 11, the width of the border region B can further be reduced, and a display device with a narrow border region can be achieved.

In the present disclosure, FIG. 2 is a perspective view showing possible profiles of the first sidewall 1131 and the third surface 131, but the present disclosure is not limited thereto. In addition, the first roughness and the second roughness can respectively refer to $R_z$ of the first sidewall 1131 and the third surface 131. The first roughness and the second roughness can be respectively defined by the following definition. The value of the "roughness" of a surface or a sidewall is obtained based on the ten-point height of irregularities ($R_z$) which is defined as the average distance between the five highest peaks and the five deepest valleys within the evaluation length. In more details, the ten-point height of irregularities ($R_z$) is calculated according to the following equation:

$$R_z = \frac{1}{5}\sum_{i=1}^{5} R_{pi} - R_{vi}$$

wherein $R_{pi}$ and $R_{vi}$ are the $i^{th}$ highest peak, and the $i^{th}$ lowest valley respectively.

In the present embodiment, the display device further comprises: a first conductive layer 14 disposed on and electrically connected to the bonding element 13. Moreover, the display device further comprises: an insulating layer 12 disposed between the substrate 11 and the bonding element 13, wherein the insulating layer 12 has a second via 121, the second via 121 connects to the first via 113 and exposes the third surface 131 of the bonding element 13. Herein, the second via 121 has a second sidewall 1211 having a third roughness, and the first roughness of the first sidewall 1131 is greater than the third roughness of the second sidewall 1211. In addition, the insulating layer 12 extends beyond the first sidewall 1131 of the first via 113 by a first distance d1, and the first distance d1 is greater than 0 μm and less than or equal to 2 μm. Furthermore, the insulating layer 12 overlaps the bonding element 13 by a second distance d2, and the second distance d2 is greater than the first distance d1. When the second distance d2 is greater than the first distance d1, the bonding element 13 can protect the first conductive layer 14 from corrosion caused by the moisture penetrating into the first conductive layer 14. Herein, the first distance d1 refers to the minimum distance between the first sidewall 1131 and an edge of the insulating layer 12 and the second distance d2 refers to a minimum distance between the edge of the insulating layer 12 and a bonding edge 132 of the bonding element 13.

In the present embodiment, a first angle θ1 is included between the first sidewall 1131 and the third surface 131, and the first angle θ1 is greater than 90 degrees and less than or equal to 160 degrees. If the first angle θ1 is too small, the binding strength of the connecting element 34 to the first sidewall 1131 and the third surface 131 may be decreased. In addition, a second angle θ2 is included between the third surface 131 and a second sidewall 1211 of the second via 121, and the first angle θ1 can be different from the second angle θ2. In one embodiment of the present disclosure, the first angle θ1 is greater than the second angle θ2. It could be understood that the first sidewall 1131, the third surface 131, and the second sidewall 1211 may have certain roughness. Therefore, the angle between a surface and a sidewall is measured according to a mean line of the surface and a mean line of the sidewall. The mean line is located so the sum of areas above the mean line is equal to the sum of areas bellow the mean line.

In the present embodiment, the circuit element 31 is disposed on the second surface 112 of the substrate 11. More specifically, because the display device of the present embodiment further comprises a supporting film 15 disposed between the second surface 112 of the substrate 11 and the circuit element 31, the circuit element 31 is not directly disposed on the second surface 112. However, in another embodiment of the present disclosure, a part of the circuit element 31 may be directly disposed on the second surface 112 of the substrate 11 if the supporting film 15 is removed after the etching process.

In the present embodiment, the display device may further comprise: a protruding element 33 disposed on a side of the circuit element 31 facing the bonding element 13. In particular, the protruding element 33 is disposed to correspond to the bonding element 13. Herein, the material of the protruding element 33 can be any conductive material, for example, a metal or an alloy (such as Cu, Ag, Au or alloy thereof), or a metal oxide (such as ITO, IZO, ITZO, IGZO, AZO or a combination thereof). The protruding element 33 can provide a raised structure to ensure the electrical connection between the circuit element 31 and the bonding element 13. In particular, the raised structure provided by the protruding element 33 can ensure the electrical connection between the circuit element 31 and the conductive particles comprised in the connecting element 34 and between the bonding element 13 and the conductive particles comprised in the connecting element 34. Furthermore, the protruding element 33 may have a curved surface or a dome shape, so the elements adjacent to the protruding element 33 may not be easily broken.

In addition, the display device may further comprise: a second conductive layer 32 disposed between the circuit element 31 and the protruding element 33, wherein the circuit element 31 electrically connects to the protruding element 33 via the second conductive layer 32. Herein, an example of the second conductive layer 32 may be a circuit layer.

In the display device of the present embodiment, the substrate 11 comprises a display region AA and a border region B. The border region B is adjacent to the display region AA. More specifically, the border region B is disposed between the display region AA and a substrate edge 114 of the substrate 11. The substrate 11 has a first thickness T1 in the display region AA. The substrate 11 has a second thickness T2 at the periphery of the first via 113 in the border region B, and the first thickness T1 is greater than the second thickness T2. Herein, the first thickness T1 refers to the minimum thickness of the substrate 11 in the display region AA, and the second thickness T2 also refers to the minimum thickness of the substrate 11 at the periphery of the first via 113. When the first thickness T1 is greater than the second thickness T2, the circuit element 31 can be embedded into the periphery of the first via 113, to ensure the electrical connection between the circuit element 31 and the bonding element 13. Herein, because the thickness of the substrate 11 is reduced in the border region, the circuit element 31 can further be embedded into the periphery of the first via 113 of the substrate 11, and a display device with a narrow border region or thin thickness can be achieved.

In the present embodiment, the display device further comprises: a display medium 21 disposed on the first conductive layer 14 and on the display region AA of the substrate 11; an overcoating layer 22 disposed on the display medium 21; and a sealing layer 23 disposed on the overcoating layer 22. In some embodiments, the overcoating layer 22 can be omitted. In the present embodiment, the display medium 21 can be a self-emission display medium. Examples of the self-emission display medium may comprise organic light-emitting diodes (OLEDs), inorganic light-emitting diodes (LEDs), mini light-emitting diodes (mini-LEDs), micro light-emitting diodes (micro-LEDs), or quantum-dot light-emitting diodes (QLEDs). It could be understood that the chip size of the LED is 300 μm to 10 mm, the mini-LED is 100 μm to 300 μm, and the micro-LED is 1 μm to 100 μm. But the present disclosure is not limited thereto. The overcoating layer 22 can comprise resin, photoresist, or other insulating material. The sealing layer 23 may be an inorganic layer, organic layer, inorganic-organic-inorganic (IOI) layer, or the combination thereof. However, the present disclosure is not limited thereto.

Embodiment 2

Figure 3:
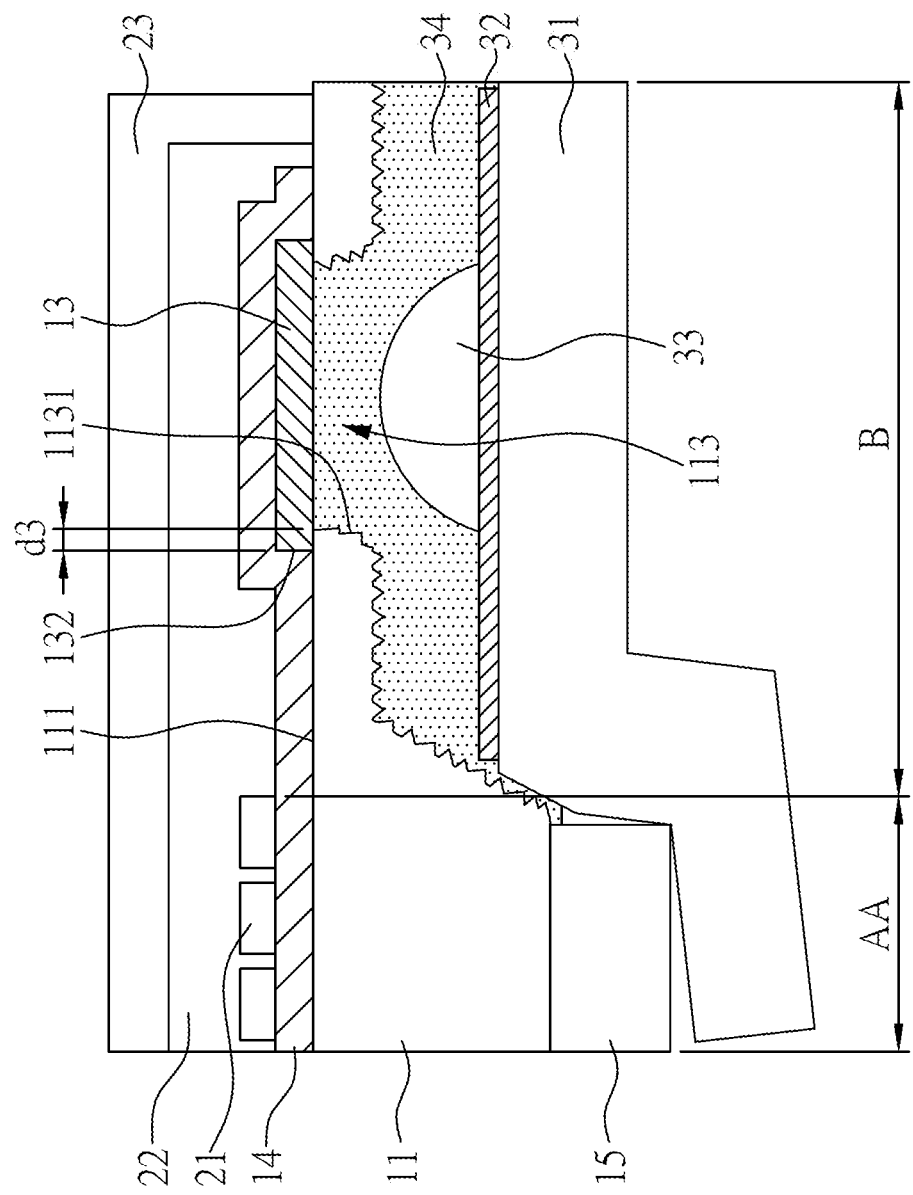
FIG. 3 is a cross-sectional view of a part of a display device according to Embodiment 2 of the present disclosure.

FIG. 3 is a cross-sectional view of a part of a display device according to the present embodiment. The display device of the present embodiment is similar to that of Embodiment 1, except that the display device of the present embodiment is not equipped with the insulating layer.

Hence, in the present embodiment, the connecting element 34 is disposed in the first via 113. The bonding element 13 is disposed on the first surface 111. In particular, the bonding element 13 has a bonding edge 132 locating on the first surface 111 and near to the first sidewall 1131, and a distance d3 between the bonding edge 132 and the first sidewall 1131 is greater than 0 μm. When there is the distance d3 between the bonding edge 132 and the first sidewall 1131, the bonding element 13 can protect the first conductive film 14 from corrosion caused by the moisture penetrating into the first conductive film 14. Herein, the distance d3 refers to the minimum distance between the bonding edge 132 and the first sidewall 1131.

Embodiment 3

Figure 4:
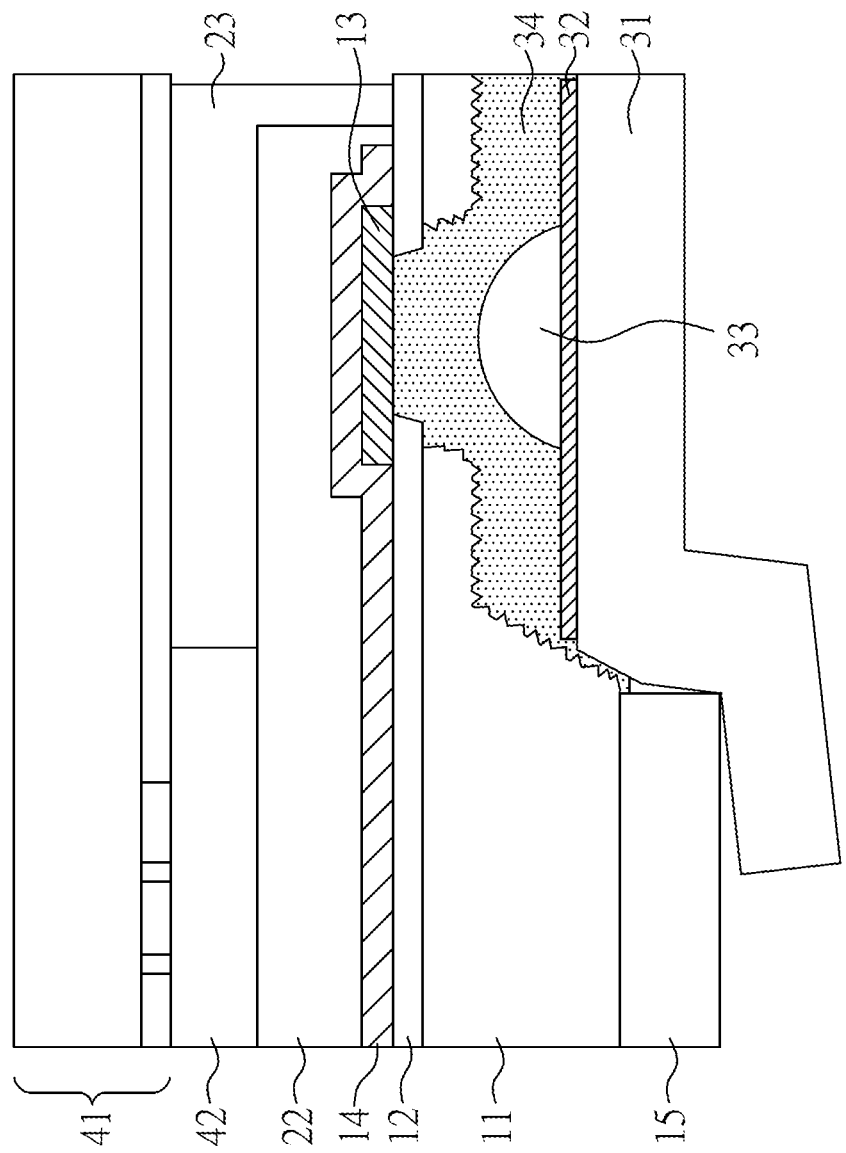
FIG. 4 is a cross-sectional view of a part of a display device according to Embodiment 3 of the present disclosure.

FIG. 4 is a cross-sectional view of a part of a display device according to the present embodiment. The display device of the present embodiment is similar to that of Embodiment 1, except that the following differences.

As shown in FIG. 2, the display device of Embodiment 1 is a display device comprising one substrate. However, in the present embodiment, the display device comprises two substrates with a display medium layer disposed therebetween. More specifically, the display device of the present embodiment further comprises: a counter substrate 41 disposed opposite to the substrate 11; and a display medium 42 disposed between the counter substrate 41 and the substrate 11. Herein, the counter substrate 41 can be a substrate with or without a color filter layer and/or a black matrix layer formed thereon. Or, in some embodiments, the color filter layer or the black matrix layer is formed on the substrate 11. In addition, the display medium 42 can be the self-emission display medium illustrated in Embodiment 1, or a non-self-emission display medium which may comprise liquid crystals (LCs). The sealing layer 23 used in the present embodiment may be a sealant or a frit. In the present embodiment, the overcoating layer 22 is disposed on the first conductive layer 14 and the display medium 42 is disposed on the overcoating layer 22. Herein, the overcoating layer 22 can be a planer layer made of an insulating material, a resin, or a photoresist.

Embodiment 4

Figure 5:
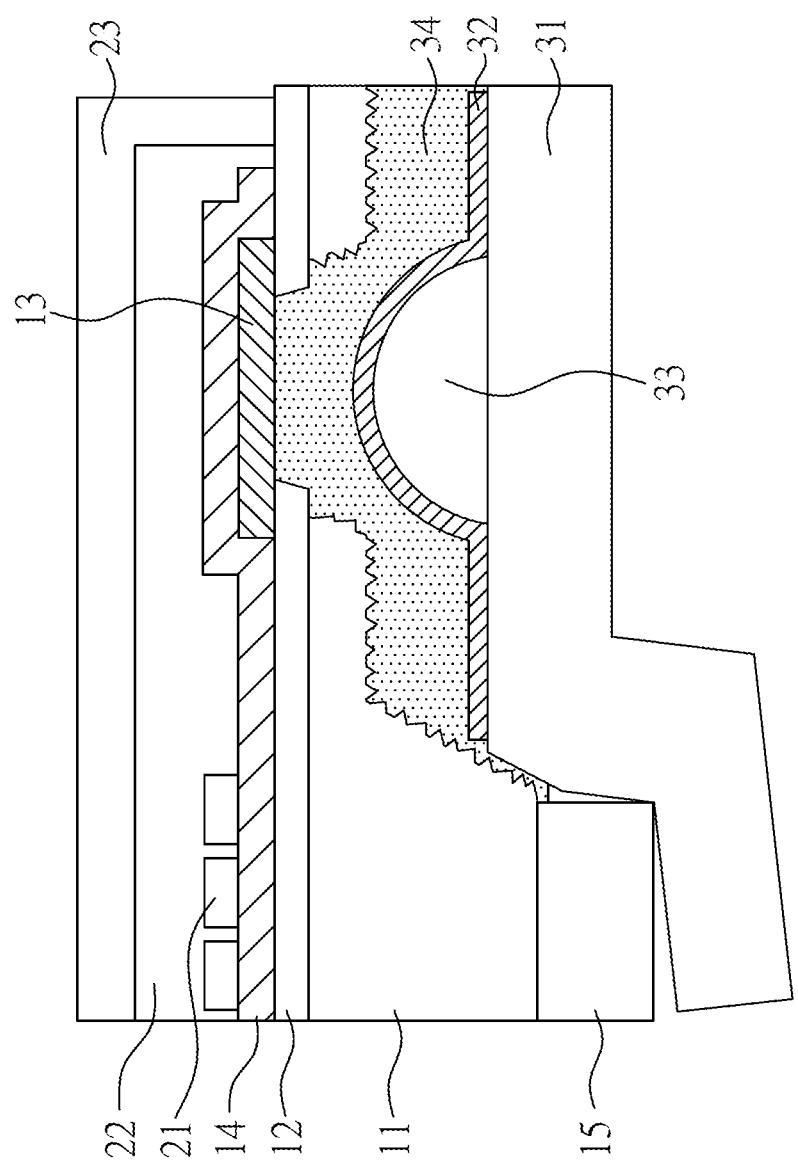
FIG. 5 is a cross-sectional view of a part of a display device according to Embodiment 4 of the present disclosure.

FIG. 5 is a cross-sectional view of a part of a display device of the present embodiment. The display device of the present embodiment is similar to that of Embodiment 1, except for the position of the second conductive layer.

In the present embodiment, the display device may further comprise: a second conductive layer 32, wherein the protruding element 33 is disposed between the circuit element 31 and the second conductive layer 32. Herein, the material for the protruding element 33 can be similar to that illustrated in Embodiment 1. Alternatively, the material for the protruding element 33 can be an insulating material, since the second conductive layer 32 is disposed on the protruding element 33 to electrically connect the circuit element 31 and the connecting element 34.

Embodiment 5

Figure 6:
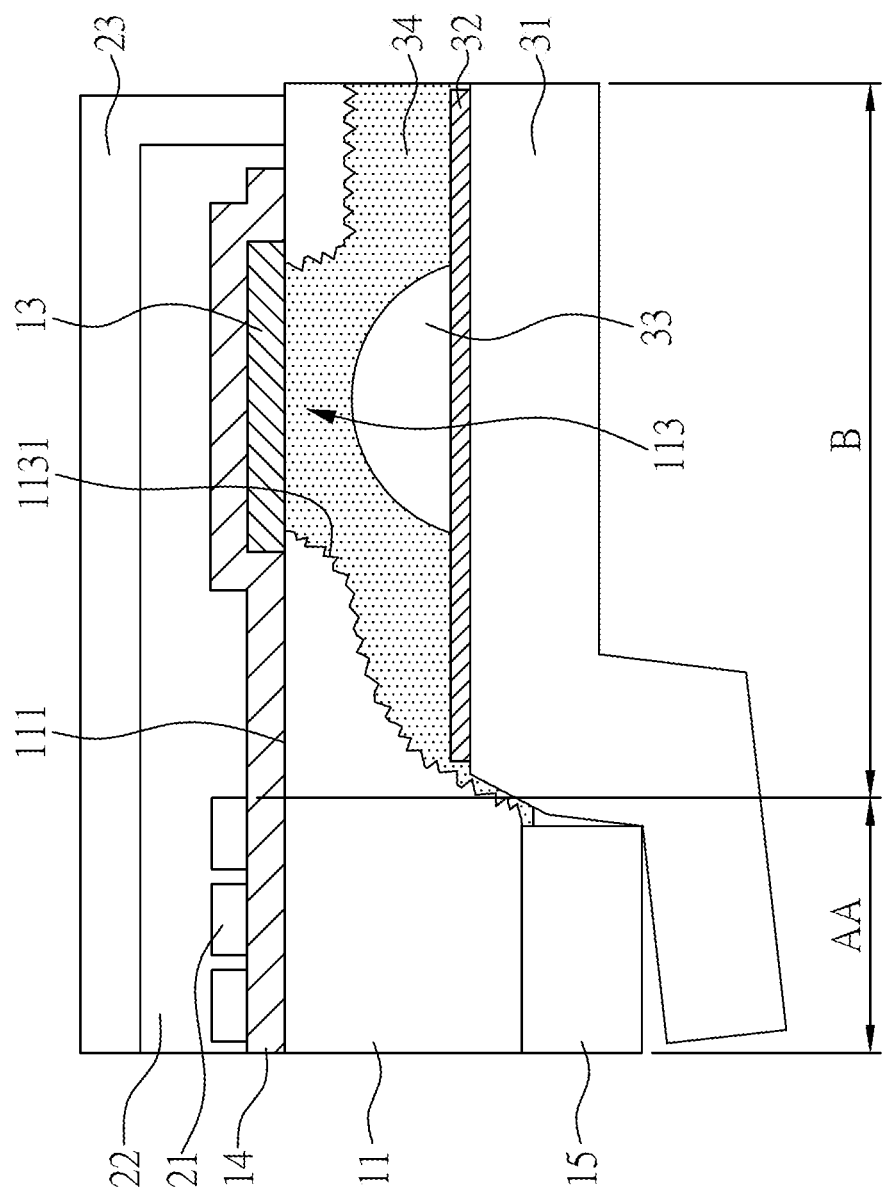
FIG. 6 is a cross-sectional view of a part of a display device according to Embodiment 5 of the present disclosure.

FIG. 6 is a cross-sectional view of a part of a display device of the present embodiment. The display device of the present embodiment is similar to that of Embodiment 2, except for the following difference.

In Embodiment 2, as shown in FIG. 3, the first sidewall 1131 of the first via 113 and the periphery of the first via 113 has a stepped profile. In the present embodiment, as shown in FIG. 6, the first sidewall 1131 of the first via 113 and the periphery of the first via 113 has a curved profile. However, in the present disclosure, the shapes of the first sidewall 1131 are not limited to the shapes shown in FIG. 1C to FIG. 6.

The display device made as described in any of the embodiments of the present disclosure as described previously can be co-used with a touch panel to form a touch display device. Meanwhile, a display device or touch display device may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display device, comprising:
   a substrate comprising a first via, a first surface and a second surface opposite to the first surface, wherein the first via has a first sidewall having a first roughness;
   a connecting element disposed in the first via;
   a bonding element disposed on the first surface, wherein the bonding element comprises a third surface in contact with the connecting element, and the third surface has a second roughness;
   a circuit element disposed on the second surface, wherein the circuit element electrically connects to the bonding element through the connecting element; and
   an insulating layer disposed between the substrate and the bonding element,
   wherein the first roughness of the first sidewall is greater than the second roughness of the third surface,
   wherein the insulating layer extends beyond the first sidewall by a first distance, the insulating layer overlaps the bonding element by a second distance, and the second distance is greater than the first distance.

2. The display device of claim 1, wherein the insulating layer has a second via, the second via connects to the first via and exposes the third surface.

3. The display device of claim 2, wherein the second via has a second sidewall having a third roughness, and the first roughness of the first sidewall is greater than the third roughness of the second sidewall.

4. The display device of claim 1, wherein the first distance is greater than 0 μm and less than or equal to 2 μm.

5. The display device of claim 2, wherein a first angle is included between the first sidewall of the first via and the third surface of the bonding element, a second angle is included between a second sidewall of the second via and the third surface of the bonding element, and the first angle is different from the second angle.

6. The display device of claim 5, wherein the first angle is greater than the second angle.

7. The display device of claim 1, wherein a first angle is included between the first sidewall of the first via and the third surface of the bonding element, and the first angle is greater than 90 degrees and less than or equal to 160 degrees.

8. The display device of claim 1, further comprising a supporting film disposed between the substrate and the circuit element.

9. The display device of claim 1, further comprising a first conductive layer electrically connected to the bonding element.

10. The display device of claim 9, further comprising a display medium disposed on the first conductive layer.

11. The display device of claim 1, further comprising a protruding element disposed on a side of the circuit element facing the bonding element.

12. The display device of claim 11, further comprising a second conductive layer disposed between the circuit element and the protruding element.

13. The display device of claim 11, further comprising a second conductive layer, wherein the protruding element is disposed between the circuit element and the second conductive layer.

14. The display device of claim 1, wherein the connecting element comprises an anisotropic conductive film.

15. The display device of claim 1, wherein the substrate comprises a display region and a border region adjacent to the display region, the substrate has a first thickness in the display region and a second thickness at a periphery of the first via in the border region, and the first thickness is greater than the second thickness.

16. A method for preparing a display device, comprising:
   providing a substrate comprising a first surface and a second surface opposite to the first surface;

forming an insulating layer on the first surface;
forming a bonding element on the insulating layer;
forming a first via penetrating the substrate;
etching a part of the substrate at a periphery of the first via;
disposing a connecting element in the first via; and
disposing a circuit element on the connecting element, wherein the circuit element electrically connects to the bonding element through the connecting element,
wherein the first via has a first sidewall having a first roughness, the bonding element comprises a third surface in contact with the connecting element, the third surface has a second roughness, and the first roughness of the first sidewall is greater than the second roughness of the third surface,
wherein the insulating layer extends beyond the first sidewall by a first distance, the insulating layer overlaps the bonding element by a second distance, and the second distance is greater than the first distance.

17. The method of claim 16, further comprising:
forming a second via penetrating the insulating layer, wherein the second via connects to the first via and exposes the third surface.

18. The method of claim 16, further comprising:
forming a first conductive layer on the bonding element.

19. The method of claim 16, further comprising:
disposing a supporting film on the second surface of the substrate.

20. A display device, comprising:
a substrate comprising a first via, a first surface and a second surface opposite to the first surface, wherein the first via has a first sidewall having a first roughness;
a connecting element disposed in the first via;
a bonding element disposed on the first surface, wherein the bonding element comprises a third surface in contact with the connecting element, and the third surface has a second roughness; and
a circuit element disposed on the second surface, wherein the circuit element electrically connects to the bonding element through the connecting element,
wherein the first roughness of the first sidewall is greater than the second roughness of the third surface,
wherein a first angle is included between the first sidewall of the first via and the third surface of the bonding element, and the first angle is greater than 90 degrees and less than or equal to 160 degrees.

* * * * *